United States Patent
Miyazaki

(10) Patent No.: US 9,240,304 B2
(45) Date of Patent: Jan. 19, 2016

(54) SPECIMEN HOLDER TIP PART, SPECIMEN HOLDER HAVING SAID SPECIMEN HOLDER TIP PART, GONIO STAGE, AND ELECTRON MICROSCOPE HAVING SAID GONIO STAGE

(71) Applicant: Mel-Build Corporation, Fukuoka-shi (JP)

(72) Inventor: Hiroya Miyazaki, Kasuya-gun (JP)

(73) Assignee: Mel-Build Corporation, Fukuoka (JP)

( * ) Notice: Subject to any disclaimer, the term of this patent is extended or adjusted under 35 U.S.C. 154(b) by 0 days.

(21) Appl. No.: 14/414,682

(22) PCT Filed: Jul. 12, 2013

(86) PCT No.: PCT/JP2013/004315
§ 371 (c)(1),
(2) Date: Jan. 13, 2015

(87) PCT Pub. No.: WO2014/013709
PCT Pub. Date: Jan. 23, 2014

(65) Prior Publication Data
US 2015/0170873 A1 Jun. 18, 2015

(30) Foreign Application Priority Data

Jul. 17, 2012 (JP) .................................. 2012-158550
Sep. 27, 2012 (JP) .................................. 2012-214258

(51) Int. Cl.
*H01J 37/00* (2006.01)
*H01J 37/20* (2006.01)
*H01J 37/26* (2006.01)

(52) U.S. Cl.
CPC ............... *H01J 37/20* (2013.01); *H01J 37/261* (2013.01); *H01J 2237/2007* (2013.01); *H01J 2237/20207* (2013.01); *H01J 2237/20214* (2013.01)

(58) Field of Classification Search
CPC .................... H01J 37/20; H01J 37/261; H01J 2237/20214; H01J 2237/2007; H01J 2237/20207
USPC ......................................... 250/440.11, 442.11
See application file for complete search history.

(56) References Cited

U.S. PATENT DOCUMENTS

| 4,596,934 A * | 6/1986 | Yanaka et al. ........... 250/442.11 |
| 5,225,683 A * | 7/1993 | Suzuki et al. ............ 250/442.11 |
| 6,002,136 A * | 12/1999 | Naeem ...................... 250/442.11 |
| 2011/0057100 A1 * | 3/2011 | Nakazawa et al. ............ 250/307 |

FOREIGN PATENT DOCUMENTS

| JP | H-8-273571 | 10/1996 |
| JP | H-11-135048 | 5/1999 |
| JP | 2005-26530 | 1/2005 |
| JP | 2008-173766 | 7/2008 |
| JP | 2010-40505 | 2/2010 |

* cited by examiner

*Primary Examiner* — Michael Maskell
(74) *Attorney, Agent, or Firm* — ALG Intellectual Property, LLC

(57) ABSTRACT

In at least one embodiment, a specimen holder tip part comprises a specimen setting seat, a specimen mesh for mounting a specimen, a specimen holding part for holding the specimen mesh and a clamping part that clamps the specimen holding part.

18 Claims, 15 Drawing Sheets (a)

(b)

(a)  (b)

(a)

(b)

SPECIMEN HOLDER TIP PART, SPECIMEN HOLDER HAVING SAID SPECIMEN HOLDER TIP PART, GONIO STAGE, AND ELECTRON MICROSCOPE HAVING SAID GONIO STAGE

TECHNICAL FIELD

The present inventions relate to a specimen holder tip part, specimen holder having the specimen holder tip part, and particularly relate to a specimen holder tip part, specimen holder having the specimen holder tip part having a specific specimen holding means.

Further, the present inventions relate to a goniometer stage, and an electron microscope having the goniometer stage, and particularly relate to a goniometer stage, and an electron microscope having the goniometer stage having a valve opening and closing mechanism.

BACKGROUND ART

In the electron microscope such as a transmission electron microscope (TEM), when observing a specimen, for example, since a tip part of a specimen holder (referred to as specimen cradle) to be inserted into the limited space between the gap of the objective pole piece for a transmission electron microscope is needed to insert into the limited space of the objective lens pole piece, and to be inclined to the electron beam optical axis in the specimen holder axis, inevitably, the specimen cradle is made as thin as possible.

For example, as the electron microscope will be described as an example of a transmission electron microscope, the specimen to be observed by a transmission electron microscope is observed by mounting it to the specimen cradle part. In order to fix and attach a TEM specimen mesh to the specimen cradle, the specimen cradle is required for at least the cradle base unit and a specimen holding member. Further, a specimen holding is required for any fixing means to sandwich a specimen mesh in the cradle body, therefore, a means arranging a screw for fixing is generally used.

Moreover, although and the thickness of the specimen holding plate, or the size of the screw for fixing a specimen are also a prerequisite in order to effectively utilize the limited space of the objective lens pole piece, but on humans handled, there is a limit to the miniaturization, in consideration of the durability of the screw itself, there is a limit to miniaturization. The screw on the M1~M2 size at present is generally used.

Under such circumstances, as a method of exchanging a specimen, for example, a specimen exchange device made of a specimen chamber, a specimen-exchange chamber, a gate valve, a specimen exchange rod, is known (Patent Document 1).

Further, in recent years, a high resolution analysis of the electron microscope such as a transmission electron microscope (TEM: Transmission Electron Microscope), a scanning transmission electron microscopy: (STEM Scanning Transmission Electron Microscope) has advanced, for example, to the order from a nanometric to a picometric high-resolution analysis have been demanded. In a goniometer stage (Gonio) in the prior art, there is an opening and closing valve when inserting a specimen holder (Holder) from a spare chamber into a specimen chamber of a high vacuum (Patent Document 2).

PRIOR LITERATURE

Patent Literature

Patent Document 1: JP-A-08-273571
Patent Document 2: JP-A-2005-26530

DISCLOSURE OF THE INVENTION

Problems to be Resolved by the Invention

However, some proficiency is needed in the specimen exchange device including the specimen exchange device as described in Patent Document 1, since it is needed that in the case that it is fixed to a screw hole formed in a body of cradle, in the state that the specimen mesh is placed and a spacer ring is placed on it, and further is put the specimen holding plate on it while keeping the form sew the above three members, a screw is sandwiched with a pair of tweezers to keep and fit exactly to the axis position of the screw holes provided in the cradle body, and further to set up and tighten up exactly the precision screwdriver (hereinafter also referred to as a TOOL) into the groove of the slotting of the head of the above screw.

Including such a case, there are a lot of cases such as slipped case that a screw even sandwiched with a pair of tweezers even by experts is flying out in a work of mounting a specimen, or such as a case that as a result of slipping a driver or a pair of tweezers accidentally, they contact with the specimen to destroy the specimen.

Moreover, in addition, there is only about 2 mm of the thickness of the specimen cradle part of the specimen tip part in general, although when tightening the screw, the person of experience will recognize the power adjustment of minimum pressing the TOOL to tighten the screw, but if the person who is unfamiliar with handles it, a power given recklessly to the TOOL (driver) makes it possible to push it unnecessarily and thereby accidents resulting in bending the specimen cradle part in many cases. Accordingly, a simplification of a specimen mounting means in a compact design is desired.

Further, although a specimen holder has generally a specimen holding for holding a specimen and a fixing screw for fixing the specimen holding, at first, a problem occurring in the case of a clumsy human will be explained as follows. As shown in FIGS. 8 and 9, first, a method of mounting the specimen in a standard specimen holder is to loosen and remove a fixing screw for fixing the specimen. Then, after removal of the specimen holding, the specimen mesh is placed to a specimen seat and a spacer is placed so as not to shift the specimen mesh on it and the specimen holding is placed so as not to shift on it. Finally, the specimen is fixed by a fixing screw but, while guided by the screw holes with a pair of tweezers carefully so as not to shift a mesh, a spacer, a specimen holding to take the step of fastening a fixing screw with a screwdriver. Moreover, as a reason why a spacer is needed, 1. because during fastening a specimen holding with a screw for fixing a specimen, the rotation of the specimen holding makes it possible to give a damage to the specimen (bend, contact on the surface), an insertion of a spacer between a specimen and a specimen holding makes difficult to give a damage to specimen directly even if the specimen holding is rotated, 2. because there is a various sort of a thickness of the specimen mesh, it is possible to use it in order to adjust the thickness.

Moreover, in that case of a dexterous person, while loosening halfway a specimen fixing screw and lifting the specimen holding in one hand, it is needs a step that the specimen and the mesh are placed between a specimen seat and a specimen holding with the other hand to fix a fixing screw with a screwdriver. In the case of even both the clumsy human and a dexterous person, it is needed the above procedures in the specimen holding of the prior art, by the time to fix the specimen, it is necessary to pay attention to a number of the work factors.

In addition, in the steps of the clumsy person, 1. There is a possibility that it is skipped, or dropped, or lost in the worst case when removing it because a specimen holding means or a fixing means is structurally a small part. 2. Because an installation work is complex, there is a possibility that a specimen or a specimen holding must be repositioned many times. 3. Because there is a possibility that a specimen must be repositioned many times, there is a possibility that even if a specimen is made, it is dropped or crushed or punctured by a pair of tweezers or a screwdriver. 4. When fixing the fixing screws, while supporting the fixing screw in one hand with the use of a pair of tweezers, to tighten it with a screwdriver with the other hand is a very complex process. And there is a possibility that a driver or a pair of tweezers slips sometimes, it becomes the cause of the accident such as break through the specimen mesh. 5. If the specimen is allowed to stand in air for a long time, there is a possibility that it becomes a cause that the contamination makes occur and it becomes a risk that an oxidation occurs, although it is preferred that it should be loaded as soon as possible, there is a problem that it takes a long time (The vacuum transfer is ideal originally).

On the other hand, in even the procedure of a dexterous person, 1. There is a possibility that one hand is slipped to damage the specimen since for example, the specimen holding is lift with a pair of tweezers on the left and the specimen should be placed between the specimen holding and the seat with a pair of tweezers with the other hand. 2. There is a possibility that the specimen is damaged, since the specimen holding is not removed completely, if it fails to put once, it become difficult to be repositioning.

Therefore, the both placement method of the specimen may damage the specimen, it was a pain in the neck of the electron microscope user.

Further, in the prior art in Patent Document 2, an opening and closing is performed by manual valve, or while rotating the specimen holder. That is, the existing goniometer stage (Gonio), the specimen holder is inserted, and a portion set at atmospheric pressure prior to the insertion is pre-evacuated. After that, the partition valve is opened which has been cut off from high vacuum (high vacuum of housing of an electron microscope) provided to the goniometer to insert the holder. Usually, in order to open the partition valve, the steps is that by making 90°~120° rotation of the specimen holder, a valve opening and closing mechanism cylinder provided in the holding cylinder internal is driven and thereby rotating and opening a spherical valve connected to the valve opening and closing mechanism cylinder (an essential part of the partition valve).

However, although at the time of specimen data acquisition in the cooling state, the specimen holder is cooled with liquid nitrogen (called cooling specimen holder in general), because there needs to be 90°-120° rotation of the cooling specimen holder, and from the container (dewar) of the liquid nitrogen, as a result, a spillage of liquid nitrogen may occur.

Therefore, to insert a cooling specimen holder, the goniometer stage is rotated and tilted once, the rotated specimen holder (the rotation angle of the specimen holder when inserted) is inserted straightly, after pre-vacuuming, it is needed to insert after the goniostage is set back at the original position (See FIGS. 14 and 15). That is, in a state where the partition valve is closed, so as to be facing upward container (dewar) of liquid nitrogen, the cooling the specimen holder is inserted into the goniometer stage in the state that the specimen holder is rotated on the axis. Then, since after the preliminary evacuation is completed, the partition valve is rotated, although it is necessary that the container (dewar) of the liquid nitrogen is set to be upward, but its operation is risky, and the there was a need to stay in place until loading the specimen holder.

Moreover, it should be noted that, even in the general specimen holder, in order to wait for the spare exhaust (2 minutes usually), after completion, since the specimen holder is turned by hand to open the partition valve, it is necessary for the operator to stay in place.

Recently, an analysis of the electron microscope has become severe, the stability of the electron microscope room atmosphere is important, throughput is needed in industrial use. To do so, human beings are eliminated from the electron microscope as much as possible to promote stability and room temperature and the stability of the convection of air, and they should be placed in the environment as much as possible, but it was not impossible to eliminate an artificial disturbance during loading the specimen. Therefore, a development of a goniometer stage having a valve opening and closing mechanism has been desired. However, such mechanisms do not exist until now.

Therefore, in order to solve the above problems, an object of the present invention is to provide a specimen holder tip part and a specimen holder having the specimen holder tip part capable of being designed in a compact and mounting the specimen simply.

Further, in the second aspect of the present invention, in order to solve the above problems, an object of the present invention is to provide a specimen holder tip part and a specimen holder having the specimen holder tip part capable of mounting the specimen simply.

Further, in the third aspect of the present invention, an object of the present invention to solve the above problems is to provide a goniometer stage having a valve opening and closing mechanism.

Means of Solving the Problems

In order to achieve the above object, the result of analyzing the accidents involving the specimen change of the specimen holder and intensive studies, the present inventors have come to find the present invention.

That is, a specimen holder tip part according to the present invention is characterized by comprising a specimen setting seat, a specimen mesh for mounting a specimen, a specimen holding part for holding the specimen mesh and a clamping part that clamps the specimen holding part.

Further, in a preferred embodiment of a specimen holder tip part according to the present invention, it is characterized in that the specimen holding part is a ring-shaped.

Further, in a preferred embodiment of a specimen holder tip part according to the present invention, it is characterized in that it has a tapered or a convex portion in a side surface of the specimen holding part.

Further, in a preferred embodiment of a specimen holder tip part according to the present invention, it is characterized in that the specimen holding part is a beads shaped ring-shaped.

Further, in a preferred embodiment of a specimen holder tip part according to the present invention, it is characterized in that the clamping part clamps with the use of a tapered or a convex portion in a side surface part of the specimen holding part.

Further, in a preferred embodiment of a specimen holder tip part according to the present invention, it is characterized in that the clamping part comprises an elastic member.

Further, in a preferred embodiment of a specimen holder tip part according to the present invention, it is characterized in that the clamping part is a spring pin.

Further, in a preferred embodiment of a specimen holder tip part according to the present invention, it is characterized in that the specimen holding part has a desorption means for desorbing the specimen holding part from the specimen holder tip part.

Further, in a preferred embodiment of a specimen holder tip part according to the present invention, it is characterized in that the desorption means is a groove disposed on the internal diameter side of a ring-shaped member.

Further, a detachment tool for detaching the specimen holding part corresponding to the desorption means according to the present invention.

A kit according to the present invention is characterized by comprising a specimen holder tip part according to the present invention and a detachment tool according to the present invention.

A specimen holder according to the present invention is characterized by comprising a specimen holder tip part according to the present invention.

Further, in the second aspect, in order to achieve the above object, the result of analyzing the accidents involving the specimen change of the specimen holder and intensive studies, the present inventors have come to find the present invention.

That is, a specimen holder tip part according to the present invention is characterized by comprising a specimen setting seat, a specimen mesh for mounting a specimen, a specimen holding means for holding the specimen mesh, a fixing means for fixing the specimen holding means, wherein the specimen holding means has an elastic member.

Further, in a preferred embodiment of a specimen holder tip part according to the present invention, it is characterized in that the specimen holding means comprises one or more.

Further, in a preferred embodiment of a specimen holder tip part according to the present invention, it is characterized in that the specimen holding means fits into a groove provided on the specimen setting seat.

Further, in a preferred embodiment of a specimen holder tip part according to the present invention, it is characterized in that the specimen holding means can be movable in the longitudinal direction of the specimen holder.

Further, in a preferred embodiment of a specimen holder tip part according to the present invention, it is characterized in that the specimen holding means has a guide groove.

Further, in a preferred embodiment of a specimen holder tip part according to the present invention, it is characterized in that the elastic member is a hook.

Further, a specimen holder is characterized by comprising a specimen holder tip part according to the present invention.

Further, in the third aspect, in order to achieve the above object, the result of intensive studies on a mounting mechanism between a goniometer stage and a specimen holder, the present inventors have come to find the present invention.

A goniometer stage is characterized by having a valve opening and closing mechanism comprising a gate type of valve, a guide roller provided on the gate type of valve, a first O-ring for vacuum provided on the gate type of valve, and a shaft for driving the gate type of valve, and wherein the gate type of valve and the shaft are rotatable by at least one fulcrum of the gate type of valve and the shaft.

Further, in a preferred embodiment of a goniometer stage according to the present invention, it is characterized in that the valve opening and closing mechanism further has a support roller.

Further, in a preferred embodiment of a goniometer stage according to the present invention, it is characterized in that the valve opening and closing mechanism has a tapered portion for guiding the guide roller.

Further, in a preferred embodiment of a goniometer stage according to the present invention, it is characterized in that the shaft has a second O-ring for vacuum.

Further, in a preferred embodiment of a goniometer stage according to the present invention, it is characterized in that the shaft exists in a shaft holding cylinder within a specimen holder holding cylinder.

Further, in a preferred embodiment of a goniometer stage according to the present invention, it is characterized in that the specimen holder holding cylinder has a specimen holder holding member.

Further, an electron microscope according to the present invention is characterized in that it has a goniometer stage according to the present invention.

Effect of Invention

According to the present invention, it has an advantageous effect that it is possible to minimize the damage of the holder or the like of the specimen in the specimen replacement.

Further, in a second embodiment, according to the present invention, it has an advantageous effect that it is possible to minimize the damage to the specimen and the like in the specimen replacement.

Further, in a third embodiment, according to a goniometer stage of the present invention, it has an advantageous effect that it is possible to insert it without rotating the specimen holder, and thus, insertion while cooling with liquid nitrogen is simplified, and a mistake operation such as a spillage of liquid nitrogen can be prevented. Further, according to the goniometer stage of the present invention, since the use of a gate type of valve makes it possible to omit the operation work by human of rotating the specimen holder after preliminary evacuation (Pre pump) and thereby attaining an automation. Further, according to the present invention, the automation makes it possible to reduce a residence time of an electron microscopic room, and thereby preventing contamination of the electron microscope room atmosphere caused by disturbance such as electron microscope room air flow by incomings and outgoings of human to stabilize the atmosphere of the electron microscope room. Further, according to the present invention, it has an advantageous effect that the automation makes it possible to reduce the time wherein human engages with during insertion of the Holder, and the throughput of the work itself is improved, and thereby increasing productivity.

BRIEF DESCRIPTION OF THE DRAWINGS

FIG. 1 (b) shows a cross-sectional view of the specimen after mounting in the case of using the specimen holder tip part of one embodiment of the present invention.

FIG. 3 (b) illustrates a cradle according to one embodiment of the present invention.

MODE FOR CARRYING OUT THE INVENTION

Figure 1:
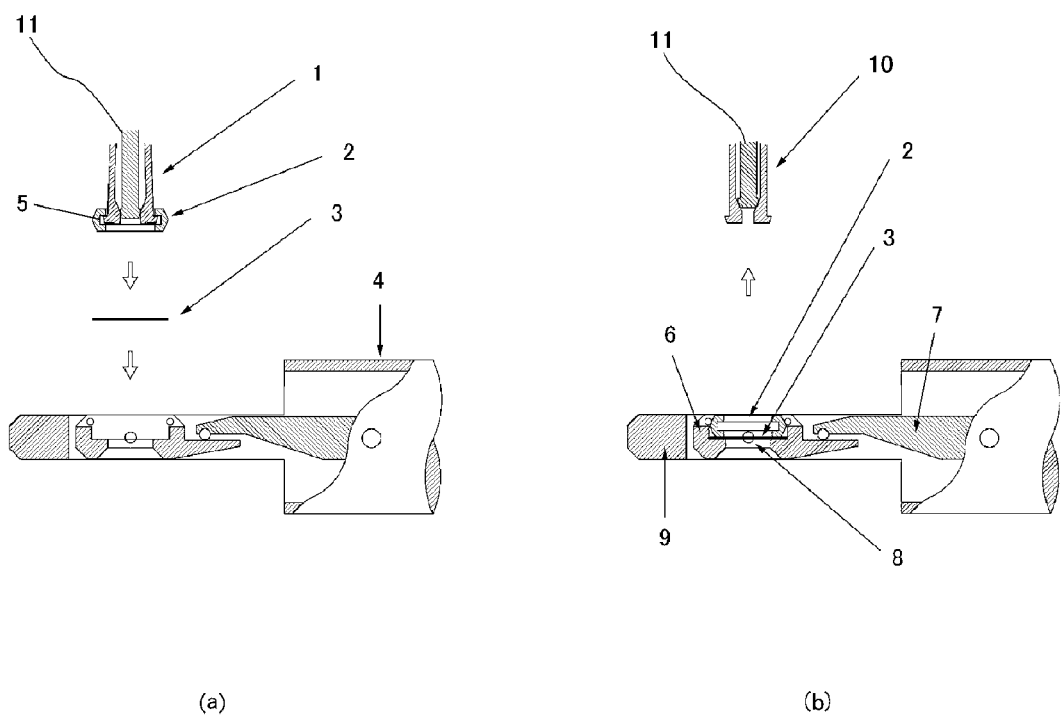
FIG. 1 is a sectional view showing a state of mounting the specimen in the case of using the specimen holder tip part of one embodiment of the present invention.

A specimen holder tip part according to the present invention is characterized by comprising a specimen setting seat, a specimen mesh for mounting a specimen, a specimen holding part for holding the specimen mesh and a clamping part that clamps the specimen holding part. The specimen setting seat is a base for mounting the specimen. Typically, the specimen mesh is placed on the specimen setting seat and the specimen is placed on the specimen mesh. It is usually when it is subjected to the microscope, the specimen mesh may be fixed. In the prior art, the specimen mesh was generally fixed through the specimen holding plate by a screw or the like to the specimen base disposed. The present invention comprises a specimen holding part for holding the specimen mesh, and a clamping part for clamping the specimen holding part. At least a part of the specimen holding part and at least a part of the clamp part have a fixed means capable of being able to be fixed to each other both the specimen holding part and the clamp part.

In a preferred embodiment, it is characterized in that the specimen holding part is a ring-shaped. Without regard to costs, as long as the theoretical shape, it can be applied in irregular rings such as a C type of ring, a star type of ring and a bobbin winding type of ring. Further, in a preferred embodiment of a specimen holder tip part according to the present invention, it is characterized in that it has a tapered or a convex portion in a side surface of the specimen holding part. It is possible by using the tapered surface that the grooves are provided on the clamping part side to design the specimen holding part in such a manner lockable. As one example that the side surface of the specimen holding portion is a tapered, in a preferred embodiment, it is characterized in that the specimen holding part is a beads shaped ring-shaped. As having a tapered surface in this manner, it has the advantage that the desorption of the clamp part can be easily.

Further, it is possible by using the convex part that a recess part is provided on the clamping part side to design the specimen holding portion in such a manner lockable. According to this design, even if there is no member such as a screw, the specimen holding part can be fixed to the specimen holder.

Further, in a preferred embodiment of a specimen holder tip part according to the present invention, it is characterized in that the clamping part comprises an elastic member. It has the advantage that an elastic member of the clamping part makes it possible to remove the specimen holding part and thereby desorption becoming easier. Although a mechanism capable of clamping is not particularly limited, but for example, a structure capable of engaging or a structure capable of hooking at least a part or the whole of the specimen holding part with at least a part or the whole of the clamping part makes it possible to fix the specimen holding part. A structure capable of engaging or a structure capable of hooking can be carried out at the contact surface between the specimen holding part and the clamping part, for example, if the specimen holding part is the ring-shaped, it may be fixed by a structure capable of engaging or a structure capable of hooking with between the outer peripheral surface of the ring-shaped structure and a clamping part.

Further, in a preferred embodiment of a specimen holder tip part according to the present invention, it is characterized in that the clamping part is a spring pin. In a preferred embodiment, in the case that the clamping part is the spring pin, if the specimen holding part is the ring-shaped having a tapered, the use of the portion of the taper makes it possible to desorb the specimen holding part and the clamping part more easily. That is, the arrangement of a rod-shaped spring pin to the cradle makes it possible to utilize the spring pin to fit into an angular projection provided on the outer periphery of the ring and thereby clamping. In the case of using a bead shaped ring-shaped, since the angular projection become a bead-like projection, the bead-like projection may be fixed to the spring pin by hooking.

Although in the following examples, it is a structure of holding the two points of the ring of holding the specimen with the two spring pins, the shape is not particularly limited as long as the ring of holding the specimen can be held by with 1 point, 2 points or 3 points, or more. In other words, if an inner diameter side spreads once than the outside of the ring of holding the specimen, and it is extensible up to the inner diameter capable of passing through the ring of holding the specimen, as long as it is an irregular ring-shaped capable of contracting in a reversible fashion (spring elements) to the inner diameter of the free state, it is possible to realize.

Further, in a preferred embodiment of a specimen holder tip part according to the present invention, it is characterized in that the specimen holding part has a desorption means for desorbing the specimen holding part from the specimen holder tip part. This is intended to facilitate desorption of the specimen holding part. The desorption means is not particularly limited to unless it is disturbing to the microscopic observation. In a preferred embodiment, it is characterized in that the desorption means is a groove disposed on the internal diameter side of a ring-shaped member. It is possible to hook the jig into the groove to make it easier to mount or remove or the like to the cradle.

Further, desorption tool of the present invention is a removable tool for detaching the specimen holding part, corresponding to the desorption means of the specimen holder tip of the present invention. That is, for example, in the case that the desorption means is a groove, it is possible to quote the detachment tool or the like having a dedicated collet such that it could get stuck with the groove. In the case that the specimen holding part is a ring-shaped, it is possible to be a detachment tool having a ring shaped collet capable of hooking on the groove in the specimen holding portion tube inner diameter.

A kit according to the present invention is characterized by comprising a specimen holder tip part according to the present invention and a detachment tool according to the present invention. For a specimen holder tip part of the present invention may be those described above. Further, as the detachment tool of the present invention may be those described above.

A specimen holder according to the present invention is characterized by comprising a specimen holder tip part according to the present invention. For a specimen holder tip part, it can be exemplified those described above.

Next, the second aspect of the present invention will be explained as follows.

A specimen holder tip part according to the present invention is characterized by comprising a specimen setting seat, a specimen mesh for mounting a specimen, a specimen holding means for holding the specimen mesh, a fixing means for fixing the specimen holding means, wherein the specimen holding means has an elastic member. Typically, the specimen mesh is placed on the specimen setting seat, and the specimen is placed on the specimen mesh. when it is subjected to the microscope, the specimen mesh may be usually fixed. In the prior art, the specimen mesh was generally fixed through the specimen holding plate by a screw or the like to the specimen setting seat. In the present invention, the specimen holding means has a elastic member. In order to have the elastic member, in the present invention, by simply loosening the fixing means for fixing the specimen holding means, the specimen holding means can begin inclination to produce a space sufficient to take the specimen in and out. Therefore, it has an advantageous effect that the use of the space makes it possible to take the specimen in and out easily and surely significantly as compared to the prior art.

Further, in a preferred embodiment of a specimen holder tip part according to the present invention, it is characterized in that the elastic member is a hook. For the elastic members, it is not particularly limited as long as it is possible to make the space. From the viewpoint that it is possible to design it easily, as the elastic member mention may be made of hooks, springs etc. Moreover, since it may be satisfied if a structure may be capable of lifting the specimen holding means and shifting it to the both side by loosening the fixing means for fixing the specimen holding means, for example, it may be provided a function capable of forming a space directly to the specimen holding means, for example, it may be provided an elastic member in the cradle side with no attachment of the elastic member such as a hook, a spring. Accordingly, in another embodiment of the present invention, it is possible to have an elastic member disposed on the specimen setting seat side. Since the elastic member can assist the operation such as a tilting of the specimen holding means by loosening the fixing means for fixing the specimen holding means, a region for inserting the specimen, an appropriate space can be formed in a region for inserting the specimen.

Further, in a preferred embodiment of a specimen holder tip part according to the present invention, the specimen holding means may comprise one or more. Because if the specimen holding means is even one unit or even multiple, it is possible to create the space and thereby being carried out taking the specimen out and in easily and surely significantly as compared to the prior art.

Further, in a preferred embodiment of a specimen holder tip part according to the present invention, it is characterized in that the specimen holding means fits into a groove provided on the specimen setting seat. The adoption of such a configuration makes it possible to prevent the specimen holding means from rotating since it is fitted within the groove provided to the specimen setting seat. No rotation of the specimen holding means makes it possible to have the advantage that it is not giving the damage (bend or in contact with the surface etc.) to the specimen.

Further, in a preferred embodiment of a specimen holder tip part according to the present invention, it is characterized in that the specimen holding means can be movable in the longitudinal direction of the specimen holder. Thus, the movable specimen holding means makes it possible to take the specimen out and in smoothly in synergy with the space. Suitable space can be created between the specimen holding means and the specimen setting seat, if the specimen holding means moves, the specimen can be produced at a desired position. And then, the specimen holding means can be moved to the original position to fix it by the fixing means at a desired position to set the specimen more reliably without damaging the specimen.

Note that although it is movable in the longitudinal direction of the specimen holder, but in the present invention, it is not limited to the direction of in the longitudinal direction. Because if the specimens holding means can be movable, it is possible to take the specimen out and in smoothly in synergy with the space.

Further, in a preferred embodiment of the specimen holder tip of the present invention, the specimen holding means may have a guide groove. The use of such a guide groove makes it possible to slid the specimen holding means laterally and easily with the use of a pair of the tweezers, as described above, when moving the specimen holding means, and thereby taking the specimen out and in easily.

The specimen holder of the present invention is characterized by comprising the specimen holder tip part of the present invention. For specimen holder tip part, it can be exemplified those described above.

Next, the following will be described for the third aspect of the present invention.

A goniometer stage according to the present invention is characterized by having a valve opening and closing mechanism comprising a gate type of valve, a guide roller provided on the gate type of valve, a first O-ring for vacuum provided on the gate type of valve, and a shaft for driving the gate type of valve, and wherein the gate type of valve and the shaft are rotatable by at least one fulcrum of the gate type of valve and the shaft. The gate type of valve is a valve capable of opening and closing the valve between specimen observation chamber (typically high vacuum) of the electron microscope and the preliminary evacuation chamber. The gate valve can be designed to move in response to movement of the shaft for driving the gate type of valve so that the gate type of valve can also open and close the valve. The guide rollers provided in the gate type of valve is disposed so as to be able to easily perform the opening and closing of the valve. Although the guide rollers provided on the gate type of valve is not essential, but the presence of the said guide roller makes it possible to carry out the opening and closing of the valve more smoothly than those of the case that there is no guide roller. Moreover, the number of the guide rollers is not particularly limited, but in the case of installing a guide roller, it is also possible to provide a guide roller of one or more.

In addition, the first O-ring for vacuum provided to the gate type of valve is used to block off the specimen observation chamber (high vacuum) of the electron microscope with the preliminary exhaust chamber accurately. When it is set to the position where the gate type of valve closes the valve, O-ring can be sealed by highly vacuuming between the specimen observation chamber of the electron microscope and the preliminary evacuation chamber.

The shaft for driving gate type of valve is rotatably connected to a gate type of valve. For example, the gate type of valve and the shaft can be rotatable by at least one fulcrum of the gate type of valve and the shaft. For example, a substantially perpendicular direction in the longitudinal direction of the shaft is as an axis, the gate type of valve can be rotatable around the axis. By so doing, when the valve is closed, the movement of the shaft to a direction (a center direction of the electron microscope) of the specimen observation chamber of the electron microscope makes it possible to bend at an angle of 90 degrees gradually from a horizontal state to close the valve. At this time, the guide roller the support roller and a tapered part or the like makes it possible to carry out more smoothly opening and closing of the valve. Moreover, the axial direction of the supporting point is parallel to the opening and closing face of the valve. Because the opening and closing can be performed more accurately in the case that the valve is closed in such a manner that the opening and closing face is lidded by the gate type of valve to the cylinder of the high-vacuum side.

Further, in a preferred embodiment, the valve opening and closing mechanism has a support roller. Further, in a preferred embodiment, the valve opening and closing mechanism has a tapered portion for guiding the guide roller. In the valve opening and closing mechanism, the existence of a tapered portion and the inclined portion makes it possible to allow the gate type of valve to introduce easily into a predetermined position, or to withdraw from a predetermined position in accordance with the inclination. Further, it is possible to carry out the opening and closing of the gate type of valve more accurately. The tapered portion and the support roller makes it possible to support smoothly even when the valve is opened. In the case that the valve is opened, after a preliminary evacuation chamber is pre-evacuated, if the shaft is moved from the center of the electron microscope to a direction of outside, it is possible to change the angle between the gate type of valve and the shaft from the state that the valve is closed at an angle of approximately 90 degrees to the state that the gate type of valve is in a straight line approximately with the shaft. For example, a state that become substantially aligned may be in a state in which the valve is fully open. At this time, if the guide rollers, support rollers, the tapered portion or the like exists, it is possible to support more smooth opening and closing of the valve than without these member.

For example, in the case that the shaft extends to the substantially center direction of the electron microscope cylinder (in the case that a longitudinal direction of the shaft is a substantially center direction of the electron microscope cylinder), the shaft can be movable in a direction perpendicular to the direction of the center axis of the electron microscope cylinder. Then, for example, the gate type of valve and the shaft can be set so as to be a state that the gate type of valve is closed by the elastic members, for example a spring or the like, that is, a state that the gate type of valve and the shaft is 90° approximately (it is in the case that the opening and closing face of valve is a face parallel approximately to the direction of the axis of the microscope cylinder. In this case, the longitudinal direction of the shaft will be a direction substantially perpendicular to the microscope cylinder.). By doing so, when the valve should be closed, the movement of the shaft to a direction of the specimen observation chamber makes it possible to smoothly change an angle of the gate type of valve through at least one supporting point of the gate type of valve and the shaft to close the valve successfully.

Further, in a preferred embodiment, the shaft has a second O-ring for vacuum. This is used for the blocking of the exhaust from the outside when performing pre evacuation (pre-vacuum) of the pre-evacuation chamber. Without using the second O-ring for vacuum, as long as the similar means can perform the blocking of the external, it is not particularly limited. The shaft itself may have a member capable of blocking, or it is also possible to provide an O-ring for vacuum etc., on the specimen holder holding cylinder side.

Further, in a preferred embodiment, the shaft exists in a shaft holding cylinder within a specimen holder holding cylinder. The shaft may be incorporated integrally molded into the specimen holder holding cylinder, or separately, by forming the shaft holding cylinder, the shaft can be incorporated into the shaft holding cylinder. In order to open and close the valve, the shaft is not particularly limited as long as it can be movable.

Further, in a preferred embodiment, the specimen holder holding cylinder has a specimen holder holding member. The specimen holder holding member is responsible for holding the specimen holder in the position of the pre-exhaust state of the specimen holder. As the specimen holder holding member, mention may be made of the hook etc. After completing the preliminary exhaust, the integration of the specimen holder holding member makes it possible to open the gate type of valve remotely and if the specimen holder holding member for holding the specimen holder, for example, hook can be operated remotely, a step of pre-exhausting when mounting specimen and a step of inserting the specimen holder can be remotely performed. By doing so, since it is possible to leave for the electron microscope room promptly if the specimen holder is loaded on the goniometer stage once, it has the advantage that it can stop a disturbance of the environment of the electron microscope room at a minimum. Furthermore, when using a cooling specimen holder, it is possible to avoid the dangerous accidents of overflowing liquid nitrogen.

EXAMPLE

Here will be described an embodiment of the specimen holder tip part of the present invention, the invention is not to be construed as being limited to the following examples. Further, without departing from the scope of the present invention, appropriately modified are of course possible.

Example 1

The following will be described an embodiment of the specimen holder tip of the present invention with reference to the drawings.

FIG. 1 is a sectional view showing a state of mounting the specimen in the case of using the specimen holder tip part of one embodiment of the present invention. FIG. 1 (*b*) shows a cross-sectional view of the specimen after mounting in the case of using the specimen holder tip part of one embodiment of the present invention. In FIG. 1, 1 is a removable tool, in this example, it is a jig for attaching the ring for holding the specimen. It shows a state of the collet retaining ring for holding the specimen. 2 is a specimen holding part, in this example, it is a ring for holding specimen. 3 is a specimen mesh, 4 is a specimen holder shaft portion, 5 is a desorption means for desorbing the specimen holding part (a groove in this case), 6 is a specimen setting seat (cradle body), 7 is a link to allow the cradle to tilt, 8 is a pivot pin supporting cradle, 9 is a specimen holder tip part (pivot support frame portion) respectively. 10 is a detachable tool, in this example, it shows a jig for mounting a ring for holding the specimen. It shows a normal condition that is not an extension of the collet. 11 shows the rod mechanism of opening collet portion of the jig for attaching a ring for holding specimen.

Conventionally, it is a mainstream to screw up specimen mesh, but in the example of FIG. 1, it is fixed by the ring. Into the groove 5 formed on the inside of the ring 2 for holding specimen, is expanded the collet of the jig for attaching a ring for holding specimen to enter well into the groove to hold the ring 2. In the example of FIG. 1, the expansion of the collet has a mechanism to spread by pushing the rod 11 into a jig for attaching 1. When pulling out the rod 11, it is a state such as FIG. 1 (*b*).

With a state that the collet is extended to hold the ring 2, it is possible to sandwich the specimen mesh 3 to fix the specimen mesh to the specimen holder tip part. If the ring 2 is induced up to the specimen setting seat 6, pulling out the rod 11 makes it possible to narrow collet to release the fixing of the ring 2 and the mounting jig. The ring 2 is clamped by the clamping part unit to be fixed to the specimen holder tip part.

Figure 2:
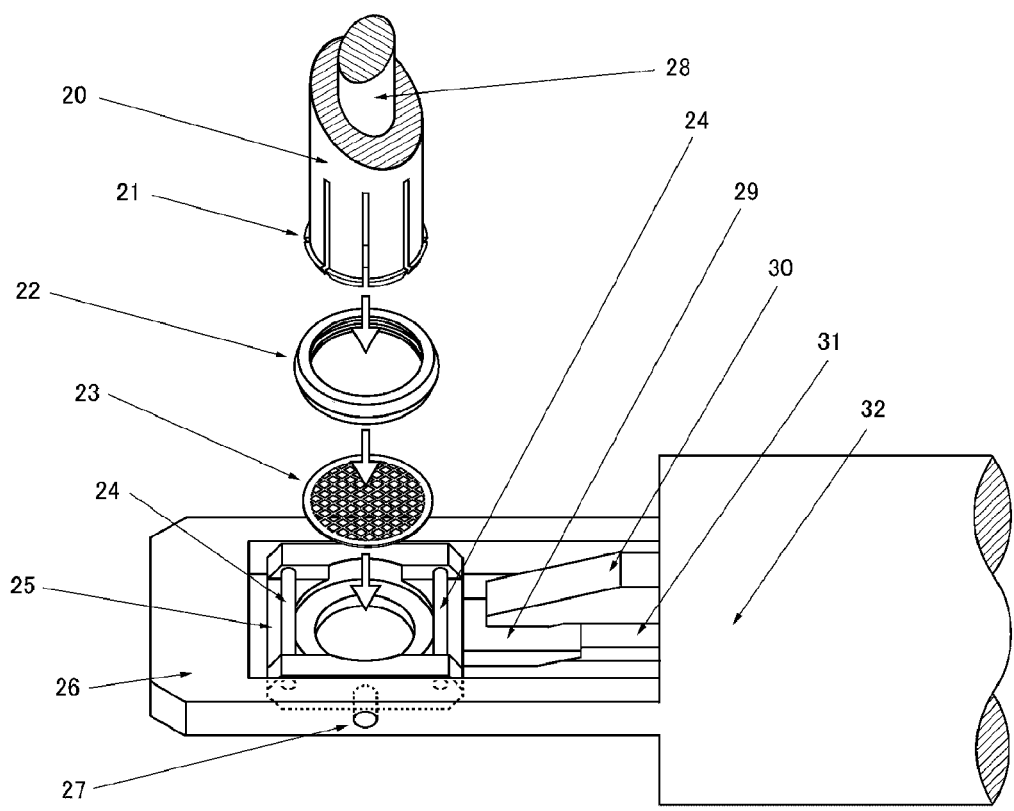
FIG. 2 shows a specimen holder tip part of one embodiment of the present invention.

FIG. 2 shows a specimen holder tip part of one embodiment of the present invention. In FIG. 2, 20 is a desorption tool (a jig for attaching a ring for holding specimen), 21 is a collet part of a jig for attaching a ring for holding specimen, 22 is a specimen holding part (a ring for holding specimen), 23 is a specimen mesh, 24 a clamp part (a clamp bar spring of a ring for holding specimen), 25 is a specimen setting seat, 26 is a frame portion for supporting pivot, 27 is a pivot pin for supporting cradle, 28 is a rod with mechanism of opening the collet part of the jig for attaching a ring for holding specimen. 29 is a receiving part of the power point of the cradle tilt, 30 is a link that gives the cradle tilt, 31 is a spring plate for pushing back, 32 is an axis part of the specimen holder, respectively.

Inserting the jig for attaching 10 into a ring as shown in FIG. 2, a rod 28 is pushed. By doing so, the collet 21 is expanded to fit successfully into the groove within the ring 22 and thereby the ring 22 and mounting jig 20 being momentarily integrated. At a state that the jig for attaching fixes the ring 22, it is fixed through the specimen mesh 23 to the specimen holder tip part. By virtue of the taper provided on the ring 22, the ring 22 meshes with the clamp part 24 to be fixed to the specimen holder tip part. In the embodiment of FIG. 2, although a clamping part 24 and the ring 22 is fixed at two points, it may be fixed at one point or a plurality of locations.

Figure 3:
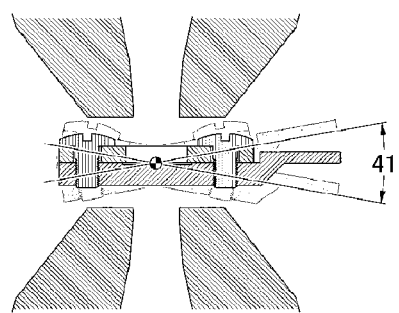
FIG. 3 (a) illustrates a standard cradle of the prior art.
Figure 3:
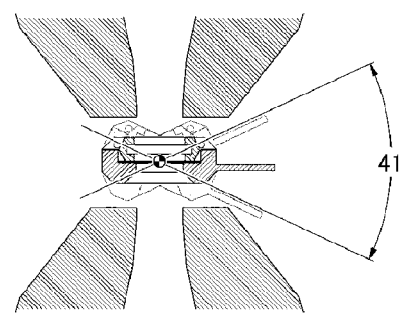
Figure 4:
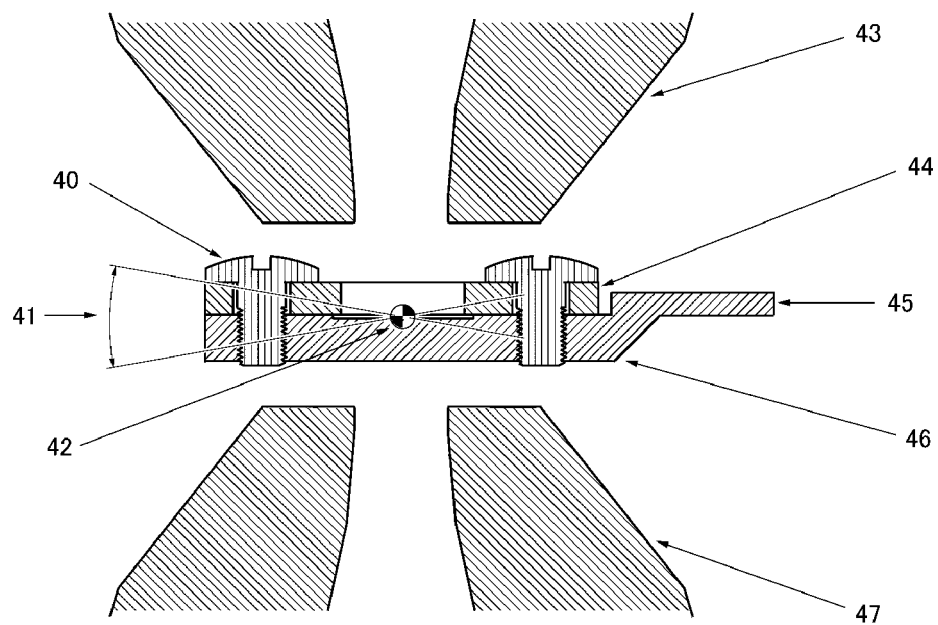
FIG. 4 shows a schematic diagram of the cradle using a fixing screw with a specimen holding plate of the prior art.

The explanation of an example of the effect of the present invention with reference to FIGS. 3 and 4 is as follows. FIG. 3 (*a*) illustrates a standard cradle of the prior art. FIG. 3 (*b*) illustrates a cradle according to one embodiment of the present invention. FIG. 4 shows a schematic diagram of the cradle using a fixing screw with a specimen holding plate of the prior art. An enlarged view of FIG. 3 (*a*) is a FIG. 4. In FIGS. 3 and 4, 40 is a fixing screw for holding a specimen, 41 is a β tilt range of motion, 42 is a β tilt pivot position, 43 is a pole piece of an upper pole of the objective lens, 44 is a specimen holding plate, 45 is a link part for a power point for driving tilt, 46 is a specimen cradle, 47 is a pole piece of a lower pole of the objective lens, respectively.

In the cradle of the prior art, it is clear from Figure that due to the presence of a screw 40 or the like, β inclinable range's ended up being limited. In contrast, it was recognized that although it is expected that in the specimen holder tip part of the present invention, the thickness and the width also become a more compact design, and a β inclinable range have been greatly enlarged and much information can be obtained from the specimen, but in fact, a specimen holder having a specimen holder tip part of the present invention, as shown in FIG. 3 (*b*), makes it possible to enlarge a β inclinable range to obtain more information from the specimen.

Example 2

The explanation of an embodiment of the specimen holder tip part of the present invention with reference to the drawings will be as follows.

Figure 5:
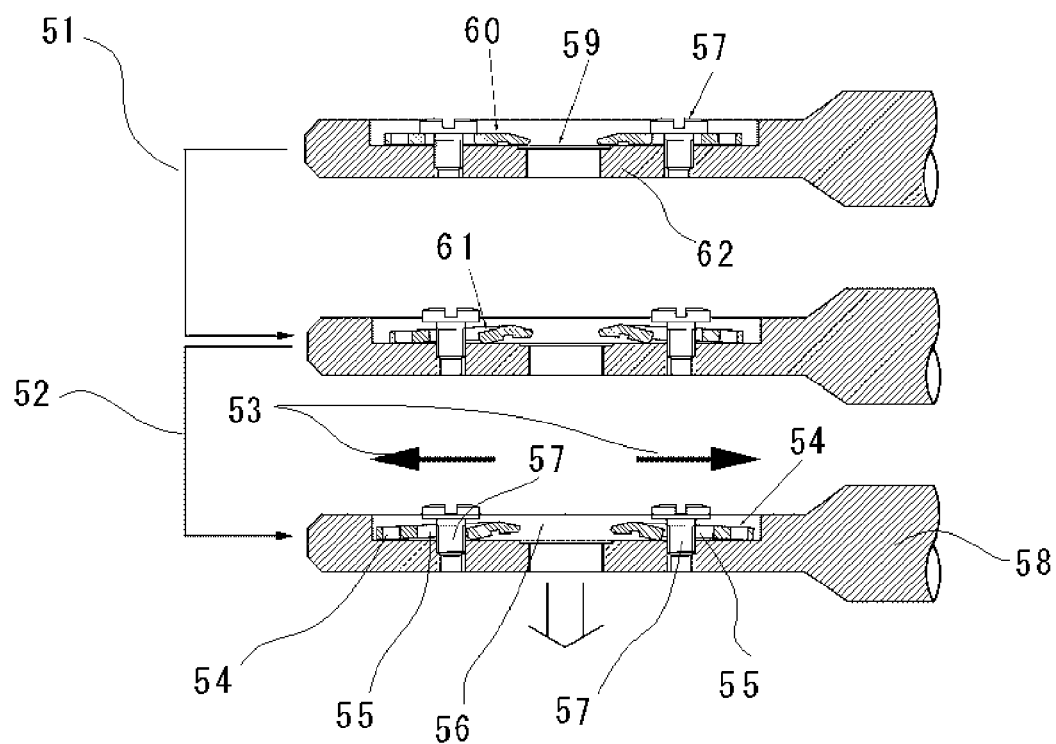
FIG. 5 shows a diagram illustrating a procedure for mounting the specimen holder tip part of one embodiment of the present invention.

FIG. 5 shows a diagram illustrating a procedure for mounting the specimen holder tip part of one embodiment of the present invention. In FIG. 5, 51 shows a schematic view from the state of being fixed by the fixing means to a state of loosening the fixing, 52 shows a schematic view from a state of loosening the fixing to a state of moving the means for holding specimen, 53 is a moving direction of the specimen holding means, 54 is a guide groove, 55 is a space for moving (groove), 56 is a grooves provided on the specimen setting seat, 57 is a fixing means, 58 is a specimen holder body, 59 is a specimen, 60 is a specimen holding means, 61 is an elastic member, 62 is a specimen setting seat (Cradle body), respectively.

Figure 8:
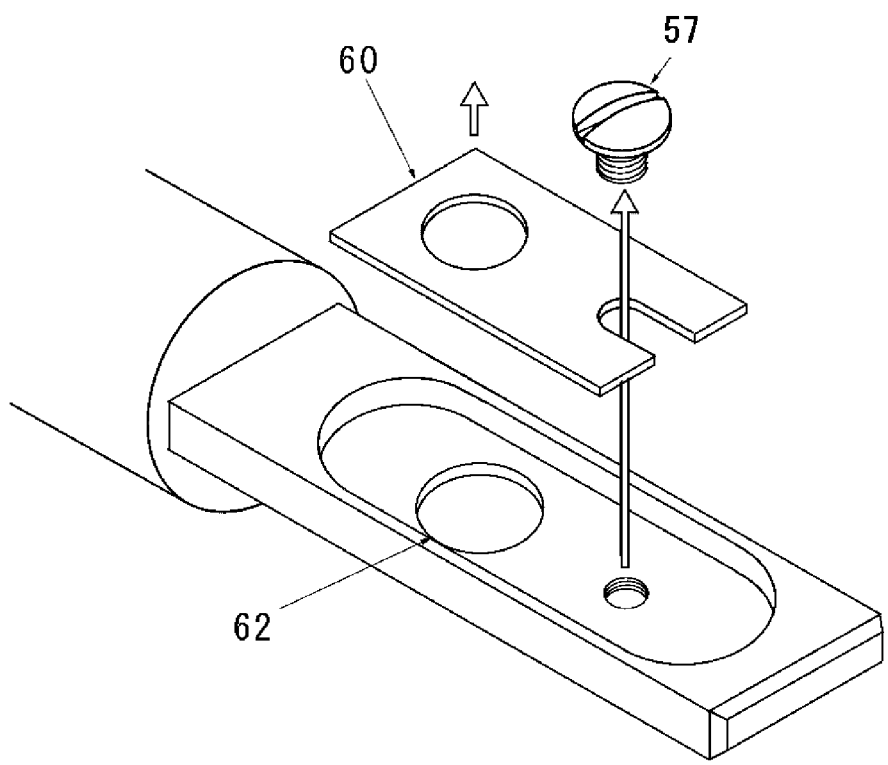
FIG. 8 shows a diagram illustrating a procedure for mounting a specimen of the prior art.
Figure 9:
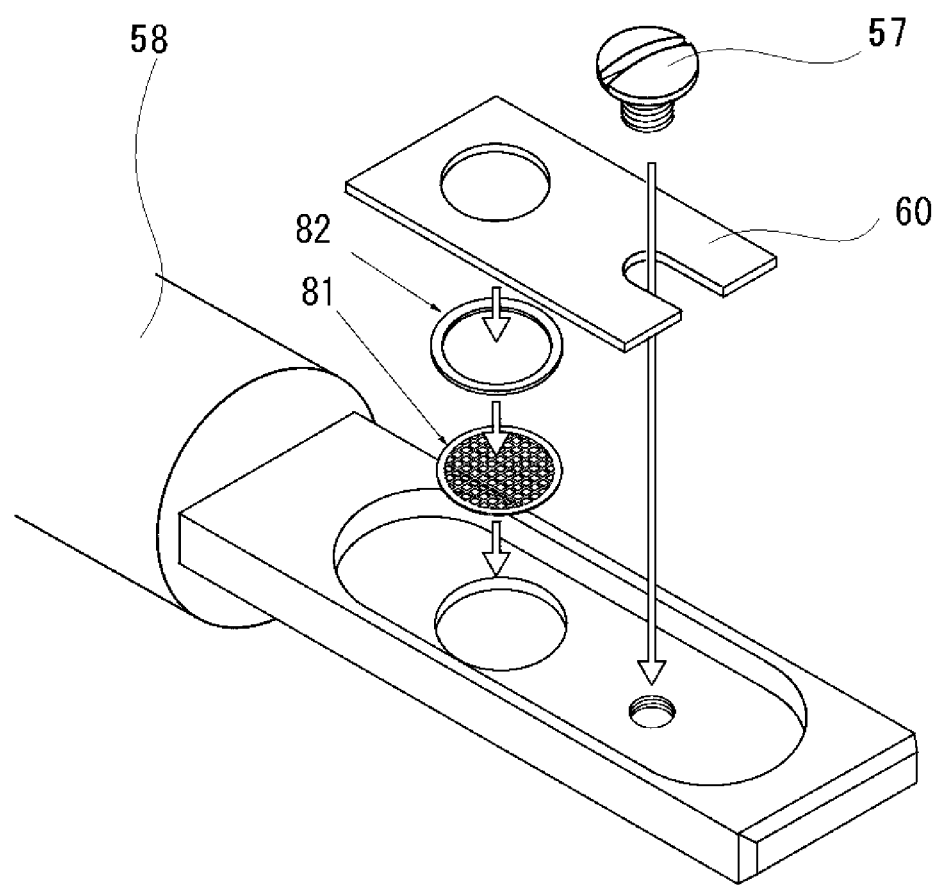
FIG. 9 shows a diagram illustrating a procedure for mounting a specimen of the prior art.

In the prior art, the following steps 1 to 7 is required: 1. the step of loosening the specimen fixing means 57, 2. the step of removing the fixing means 57 with a pair of tweezers, 3. step of removing the specimen holding means (Up to the steps 1 to 3, see FIG. 8), 4. step of placing the specimen on the specimen setting seat, 5. step of placing the specimen spacer 82 for holding the specimen, 6. step of upholding and mounting the specimen holding means with a pair of tweezers, 7. step of fixing the fixing means 57 while fixed in the correct position with a pair of tweezers (up to the steps 4-7, see FIG. 9).

Figure 6:
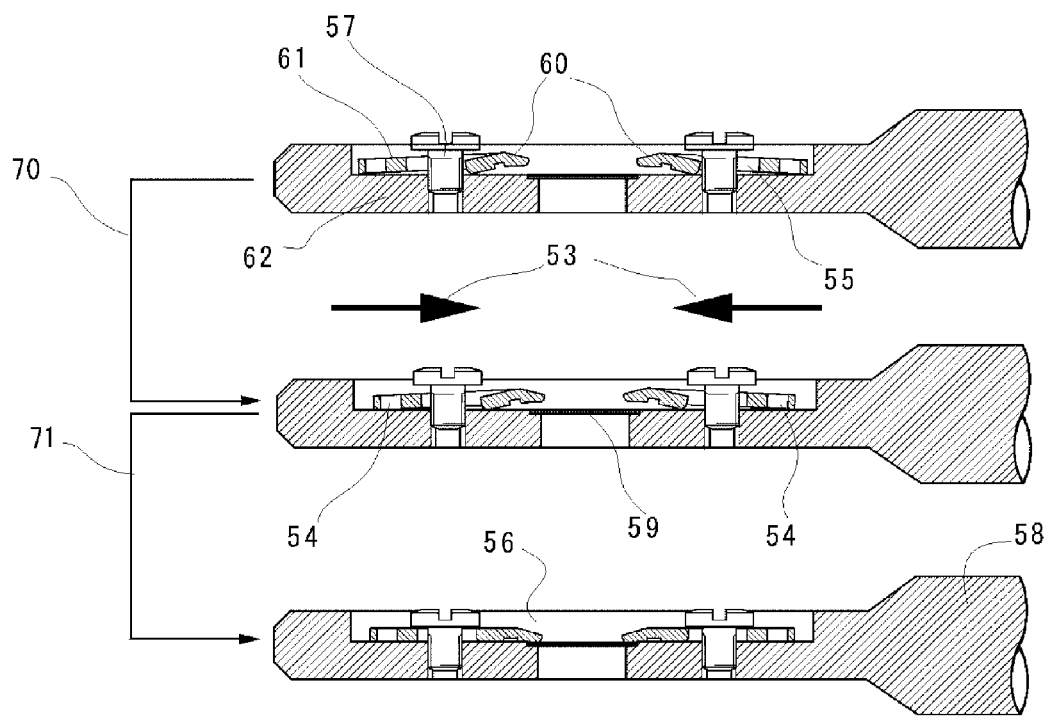
FIG. 6 shows a diagram illustrating a procedure for mounting the specimen holder tip part of one embodiment of the present invention.

On the other hand, the explanation of the procedure for installing the specimen according to one embodiment of the present invention will be as follows. First, it will be described with reference to FIGS. 5 and 6, by loosening the fixing means 57 for fixing the specimen holding means 60, not shown, the fixing of the specimen spacers and the specimen mesh for placing the specimen can be released. In FIG. 5, a screw is used as a screw fastening means 57, but it is not particularly limited as long as it is possible to fix a specimen holding means 60. If the fixing of the fixing means 57 is loosened, because the specimen holding means 60 has an elastic member 61, the specimen holding means 60 is gradually tilted to create a space on top of the location for installing the specimen. That is, if the fixing of the fixing means 57 is loosened, the elastic member 61 provided on the specimen holding means 60 makes is possible to become replacement for a spring, to lift the specimen holding means and thereby forming a space. Moreover, in the Figure, as the elastic member, a hook is used, but it is not particularly limited to this as a matter of course.

Then, in order to place specimen more accurately, by using the guide grooves 54 provided on the specimen holding means 60, the tip of a pair of the tweezers etc., is put to the guide groove 54 as indicated by the arrow 53 in FIG. 5 to be able to open the both side. By doing so, it is possible to set the specimen without touching the specimen to the device such as the specimen holding means.

That is, since the tip of the specimen holding can lift autogenously if the fixing screw is loosened, it is possible to slide sideways the specimen holding. In order to be easy to slide, a hole is opened to enter the tip of a pair of the tweezers into the holding, it is possible to move it by entering and sliding the tip of a pair of the tweezers. In the Figure, although two of the specimen holding means are arranged in symmetrical, but it may be one or more, or it is not specifically limited as long as the space can be formed.

If once the specimen is set, the specimen holding means 60 can be fixed by the fixing means. In the case that the specimen holding means 60 is moved, the use of again the guide groove 54 makes it possible to enter the tip of a pair of the tweezers into the guide groove 54 to slide and move the specimen holding means to the inside as shown by the arrow 53 in FIG. 6. Then, it is possible to fix the specimen holding means 60 by the fixing means to fix the specimen. Moreover, in the figure, because of the use of a screw as the fixing means, it is possible to complete the fixation of the specimen if the screw is fastened.

As indicated above, the installation of the elastic member such as hooks to the distal end of the specimen holding means makes it possible to allow the elastic member such as hooks to play a role in acting as a spring, only loosening the fixing means such as screws makes it possible to lift autogenously. Therefore, the specimen may be mounted as it is, according to need, a simple procedure such as just shifting the specimen holding means makes it possible to attach the specimen to the specimen holder.

Figure 7:
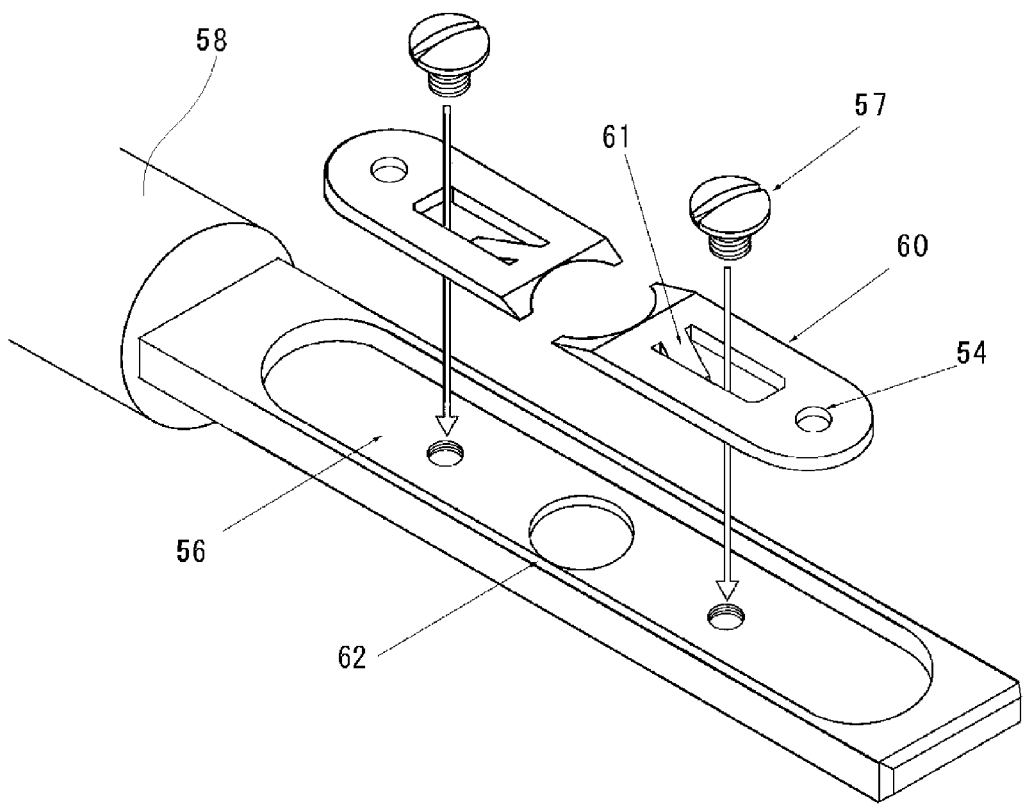
FIG. 7 shows a perspective view of the specimen holder tip part of one embodiment of the present invention.

Moreover, FIG. 7 shows a perspective view of the specimen holder tip part of one embodiment of the present invention. In FIG. 7, although the guide groove passes through the specimen holding means, but there is no need to pass through as long as it is possible to move the specimen holding means. Moreover, in FIG. 7, as the elastic member, a hook is used, but the installation of one or more elastic members to the underside of the specimen holding means into a suitable position makes it possible to form a space directly on or surrounding area of the installation position of the specimen, and thereby preventing damage to the specimen during the specimen installation.

Thus, the present invention has the following advantages and features.

That is, since by simply loosening the fixing means such as a screw, the specimen holding means is lifted, it is possible to form a space between the specimen holding means and specimen setting seat to desorb the specimen. Further, it was revealed that the portion for holding a specimen was floating to prevent that the specimen holding means hits against the surface of the specimen or that the specimen was damaged by hit from the side of the specimen mesh. In addition, it was recognized that it had been no need to re-position the specimen many times since the installation of the specimen would be smooth (improvement of work efficiency) and simplified. An effect of reducing accidents caused by mounting errors such as specimen damage can be achieved by taking to simplify the work. Moreover, it was revealed that shortening of the working time was possible, and it exhibited also a synergistic effect that can reduce contamination of the specimen.

Example 3

Then, the explanation of the present invention in a third aspect will be as follows. The electron microscope of the present invention is characterized in that it comprises a goniometer stage of the present invention described above in the third aspect. For electron microscopy, it is not particularly limited. Hereinafter, with reference to the drawings will be described an electron microscope and the goniometer stage of one embodiment of the present invention, but it is not intended that the present invention is not limited thereto.

Figure 10:
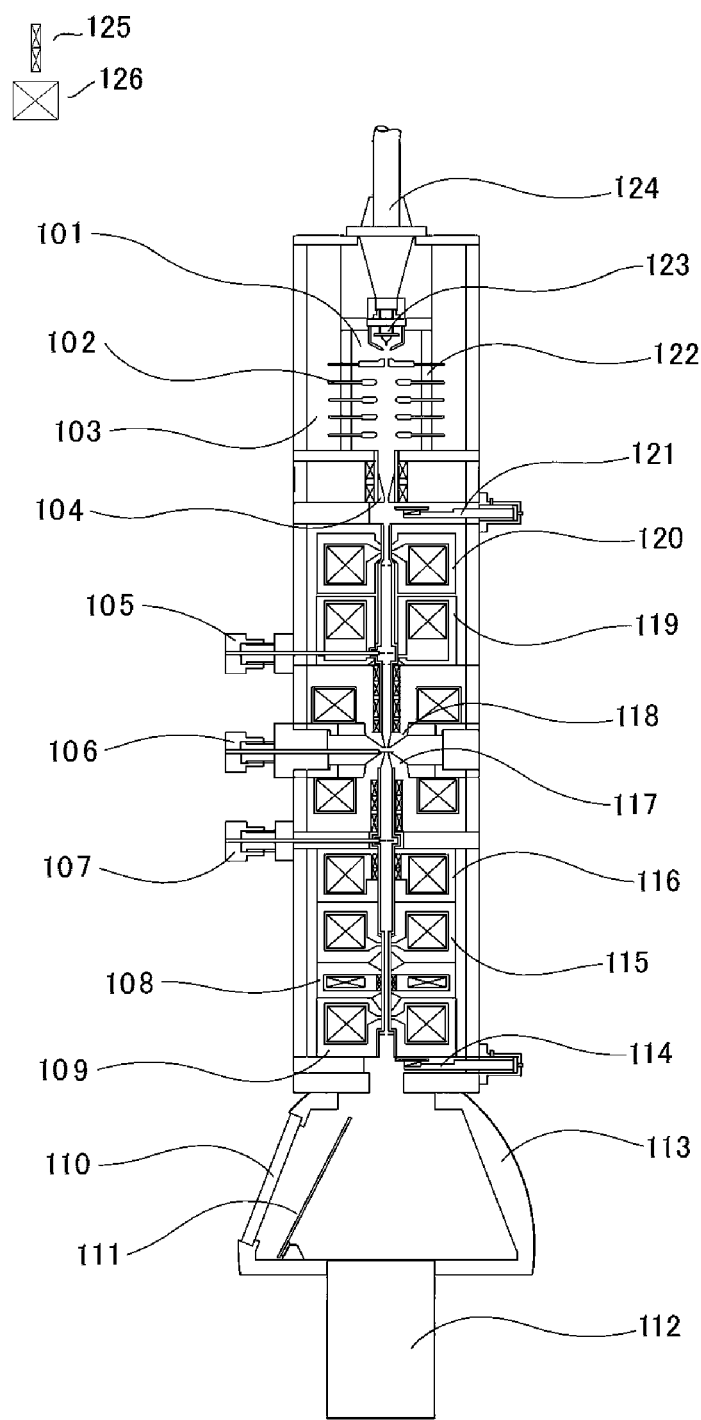
FIG. 10 shows a conceptual view of the basic structure of one example of the applicable transmission electron microscope in the present invention.

FIG. 10 shows a conceptual view of the basic structure of one example of the applicable transmission electron microscope in the present invention. In FIG. 10, 101 is a vacuum area part, 102 is an electron acceleration electrode, 103 is an insulating gas area, 104 is a X-ray absorption member, 105 is a condenser aperture (movable mechanism part), 106 is an objective aperture (movable mechanism part), 107 is an aperture for limiting a visual field (movable mechanism part), 108 is a second intermediate imaging lens, 109 is a projection lens, 110 is an observation glass window, 111 is a fluorescent screen, 112 is an image acquisition camera, 113 is a camera chamber, 114 is a valve for dividing vacuum, 115 is a first intermediate imaging lens, 116 is a back focal lens, 117 is an objective (lower pole) lens, 118 is an objective (upper pole) lens, 119 is a second converging lens, 120 is a first converging lens, 121 is a vacuum partition valve, 122 is an insulating glass, 123 is an electron beam source (filament), 124 is a cable for feeding high voltage, respectively. 125 shows a coil member for an astigmatism corrector or an electron beam deflector, and 126 shows a coil member of each convergent electron beam lens. It is possible to incorporate the goniometer stage of the present invention in the electron microscope of such an example.

Figure 11:
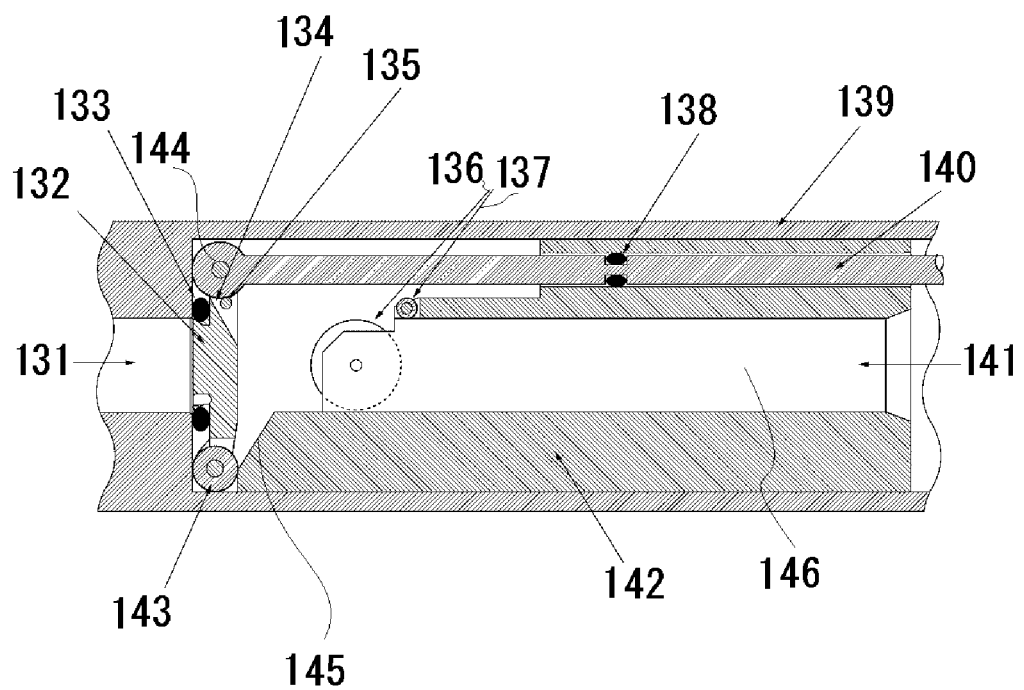
FIG. 11 shows the embodiment of a goniometer stage in one example of the present invention. It shows the state when closing the gate type of valve.
Figure 13:
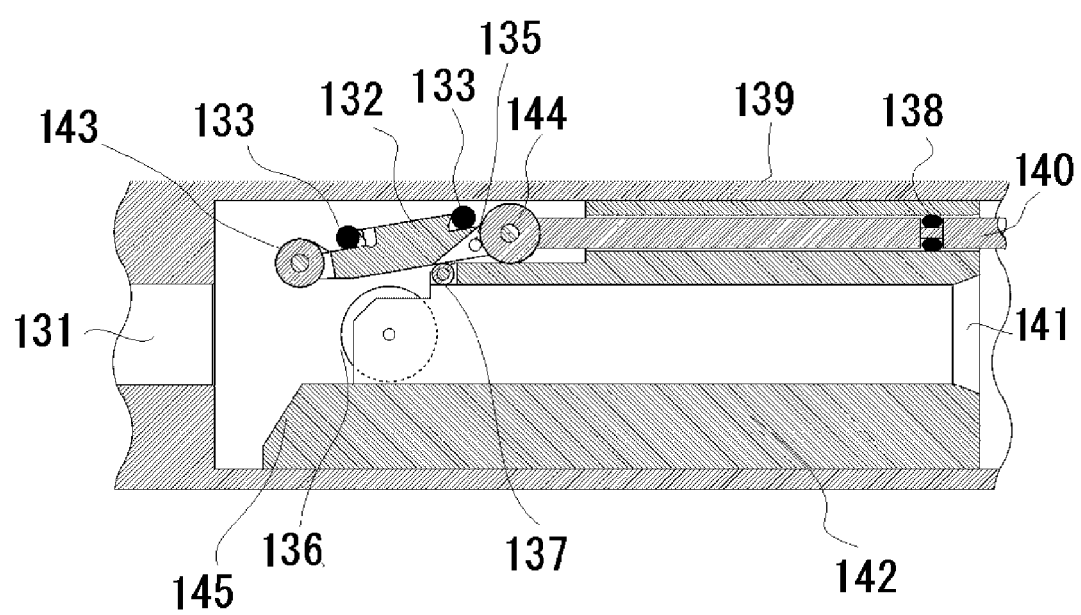
FIG. 13 shows the embodiment of a goniometer stage in one example of the present invention. It shows a state when opening a gate type of valve.
Figure 14:
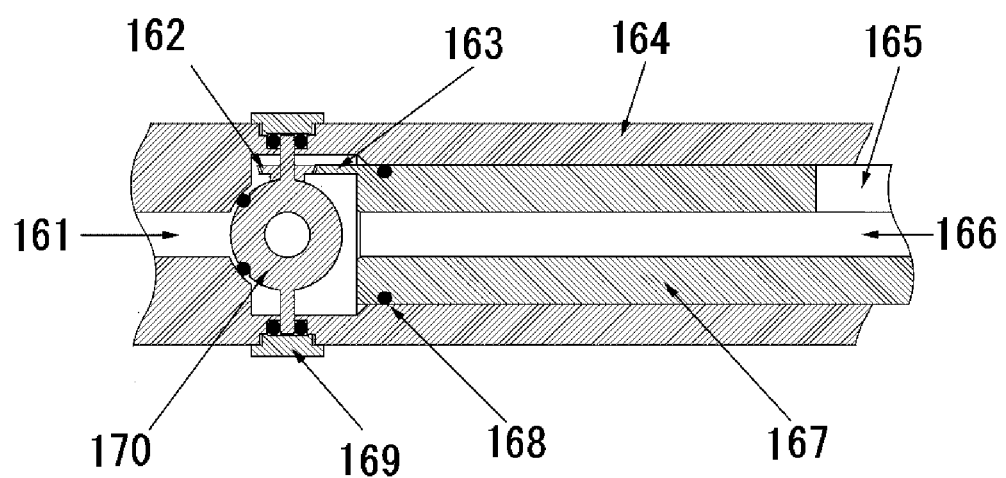
FIG. 14 illustrates an embodiment of a conventional goniometer stage. It shows a state when closing the valve.
Figure 15:
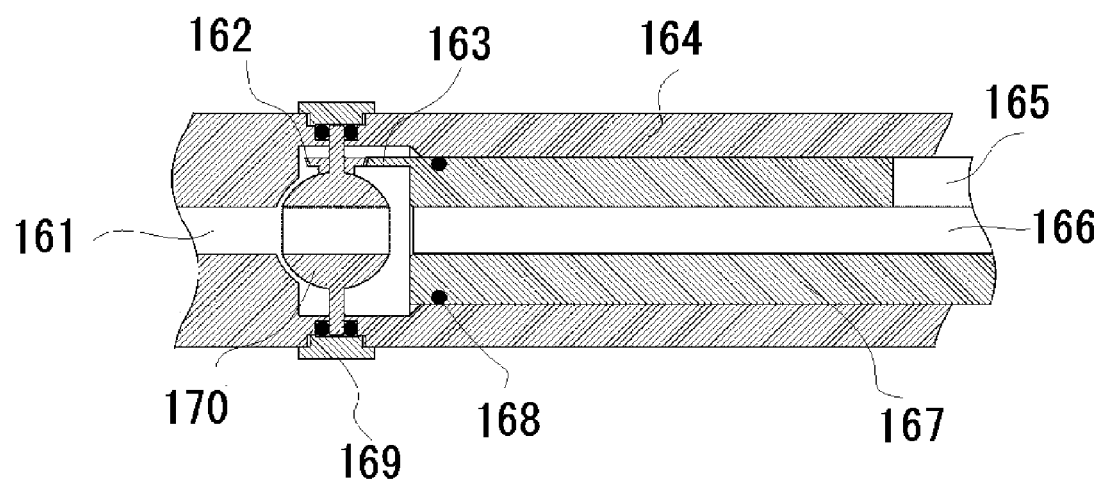
FIG. 15 illustrates an embodiment of a conventional goniometer stage. It shows a state when opening the valve.

FIG. 11 shows the embodiment of a goniometer stage in one example of the present invention. It shows the state when closing the gate type of valve. FIG. 13 shows the embodiment of a goniometer stage in one example of the present invention. It shows a state when opening a gate type of valve. FIG. 11 and in FIG. 13, 131 is a vacuum side, 132 is a gate type of valve block, 133 is an O-ring for sealing vacuum, 134 is a mounting position of an elastic members for the gate type of valve block, 135 is a pin for preventing a dropout of an elastic member for gate type of valve block, 136 and 137 are a support roller for lifting a gate type of valve block, 138 is an O-ring fir sealing vacuum, 139 is a specimen holder holding cylinder, 140 is a shaft for driving a gate type of valve block, 141 is a specimen holder insertion side, 142 is a frame of the support roller for lifting a gate type of valve and specimen holder holding cylinder, 143 is a route guide roller, 144 is a supporting point, 145 is a tapered portion, 146 is a pre-exhaust chamber, respectively. In FIG. 11, although the shaft is written at the top side, but the configuration position of the shaft or the like is not limited to since it is possible to attain a similar effect by installing at any position such as the side or the lower or the like.

Figure 12:
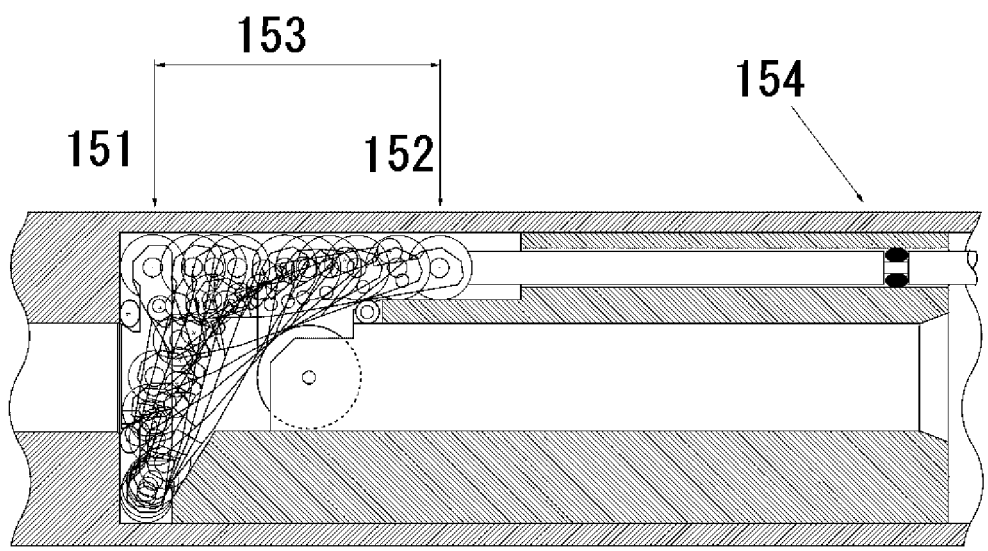
FIG. 12 shows an embodiment of a goniometers stage in one example of the present invention. It shows the movements of opening and closing the gate type of valve. It is depicted so as to overlap the trajectory of movements of opening and closing in a stepwise manner.

FIG. 12 shows an embodiment of a goniometers stage in one example of the present invention. It shows the movements of opening and closing the gate type of valve. It is depicted so as to overlap the trajectory of movements of opening and closing in a stepwise manner. In FIG. 12, 151 is a closed position of the supporting point (fulcrum), 152 is an open position of the supporting point, 153 is a piston rod stroke distance for opening and closing, 154 is a position of O-ring (O-ring position of a shaft for opening and closing the gate type of valve is described at a position of opening the gate type of valve.), respectively.

The explanation of the steps of insertion of the specimen holder, observation of the specimen, termination of specimen observation with reference to Figures will be as follows. Before the insertion of the specimen holder, it is a state in which the valve is closed as shown in FIG. 11 normally. First, the specimen holder is inserted up to pre-exhaust chamber 146. At this point, the valve is kept closed yet. If the specimen holder holding member, such as a hook is set (not shown) so that the specimen holder tip part once can stop at the position wherein it does not contact with the valve or the like, the installation of a groove etc., provided to the side of the specimen holder at the position corresponding to the specimen holder holding member makes it possible to stop temporarily.

After the specimen holder has moved to the preliminary exhaust chamber, it is possible to carry out the preliminary exhaust. If it is designed automatically to perform a preliminary evacuation by the sensor or the like, when the specimen holder is held by the specimen holder holding member, it is possible to automatically perform operations that previously relied on manual.

After performing the preliminary exhaust, the gate type of valve is opened to induce the specimen holder tip part (specimen loading section) to an observation room of the electron microscope. The shaft 140 is capable of pulling out or inserting according to an actuator, and it is possible to be automated by the computer control. That is, it is possible to perform the automation by computer control to pull the shaft to open and close the valve simultaneously with the termination signal of the preliminary exhaust. When the valve is fully opened, the signal releasing the specimen holder from the holding member makes it possible to release the specimen holder from a state wherein the holder has been fixed temporary by the holding member, and is drawn into the electron microscope in high vacuum state. In this way, it is possible to perform the specimen observation.

The specimen observation is completed, the specimen holder is held by the holding member again, an air piston or an actuator etc., makes it possible to move shaft automatically so as to close the gate type of valve. Fixation of the specimen holder by the holding member can be also releasable automatically. Thus, according to the goniometer stage of the present invention, it is possible to automate a series of operations. In other words, it is possible that all subsequent operations can be automated by inserting the specimen holder, if a specimen observation is finished, it is only necessary to go and get a specimen holder. That is, although in the prior art, the opening and closing of valves, the insertion or disinstallation of the specimen holder etc. all were needed to perform manually, but in the present invention, it is possible to automate at everything. Accordingly, since in the present invention, it is possible to prevent a mistaken operation during insertion of the specimen holder mounting the cooling specimen especially and to reduce the time until the start of observation, it has the effect of higher throughput and more productive. Further, it was revealed that the present invention had also an advantage that an atmosphere in the electron microscope chamber became stable by automation.

INDUSTRIAL APPLICABILITY

Since the specimen holder tip part of the present invention according to the first and second aspect, is also available to a various sort of a human error and it has an advantageous effect also in combination with other devices, it is expected to be beneficial in the field of in large ranges.

Further, according to the present invention according to the third aspect, since it is possible to prevent a mistaken operation during insertion of the specimen holder mounting the cooling specimen especially and to reduce the time until the start of observation, there is an effect that increases throughput and increases productivity. Since the atmosphere of the electron microscope room is stabilized by automation, it can contribute to the improvement of analysis capabilities such as reduction of the time of data acquisition and improvement of quality of analysis data, and can be applied in a wide range of technical fields.

DESCRIPTION OF THE REFERENCE NUMERALS 1 a removable tool (it is a jig for attaching the ring for holding the specimen. It shows a state of the collet retaining ring for holding the specimen.)
2 a specimen holding part (it is a ring for holding specimen.)
3 a specimen mesh
4 a specimen holder shaft portion
5 a desorption means for desorbing the specimen holding part (a groove)
6 a specimen setting seat (cradle body)
7 a link to allow the cradle to tilt
8 a pivot pin supporting cradle
9 a specimen holder tip part (pivot support frame portion)
10 a detachable tool (it shows a jig for mounting a ring for holding the specimen. It shows a normal condition that is not an extension of the collet.)
11 the rod mechanism of opening collet portion of the jig for attaching a ring for holding specimen.
20 a desorption tool (a jig for attaching a ring for holding specimen)
21 a collet part of a jig for attaching a ring for holding specimen
22 a specimen holding part (a ring for holding specimen)
23 a specimen mesh
24 a clamp part (a clamp bar spring of a ring for holding specimen)
25 a specimen setting seat
26 a frame portion for supporting pivot
27 a pivot pin for supporting cradle
28 a rod with mechanism of opening the collet part of the jig for attaching a ring for holding specimen
29 a receiving part of the power point of the cradle tilt
30 a link that gives the cradle tilt
31 a spring plate for pushing back
32 an axis part of the specimen holder
40 a fixing screw for holding a specimen
41 a β tilt range of motion
42 a β tilt pivot position
43 a pole piece of an upper pole of the objective lens
44 a specimen holding plate
45 a link part for a power point for driving tilt
46 a specimen cradle
47 a pole piece of a lower pole of the objective lens
51 a schematic view from the state of being fixed by the fixing means to a state of loosening the fixing
52 a schematic view from a state of loosening the fixing to a state of moving the means for holding specimen
53 a moving direction of the specimen holding means
54 a guide groove
55 a space for moving (groove)
56 a grooves provided on the specimen setting seat
57 a fixing means
58 a specimen holder body
59 a specimen
60 a specimen holding means
61 an elastic member
62 a specimen setting seat
70 a pattern diagram from a state of setting a specimen to a state of moving a specimen holding means to a direction as shown in an arrow 71 a pattern diagram from a state of moving a specimen holding means to a state of fixing by a fixing means
81 a specimen mesh
82 a specimen spacer
101 a vacuum area part
102 an electron acceleration electrode
103 an insulating gas area
104 a X-ray absorption member
105 a condenser aperture (movable mechanism part)
106 an objective aperture (movable mechanism part)
107 an aperture for limiting a visual field (movable mechanism part)
108 a second intermediate imaging lens
109 a projection lens
110 an observation glass window
111 a fluorescent screen
112 an image acquisition camera
113 a camera chamber
114 a valve for dividing vacuum
115 a first intermediate imaging lens
116 a back focal lens
117 an objective (lower pole) lens
118 an objective (upper pole) lens
119 a second converging lens
120 a first converging lens
121 a vacuum partition valve
122 an insulating glass
123 an electron beam source (filament)
124 a cable for feeding high voltage
125 a coil member for an astigmatism corrector or an electron beam deflector
126 a coil member of each convergent electron beam lens
131 a vacuum side
132 a gate type of valve block
133 an O-ring for sealing vacuum
134 a mounting position of an elastic members for the gate type of valve block
135 a pin for preventing a dropout of an elastic member for gate type of valve block
136, 137 a support roller for lifting a gate type of valve block
138 an O-ring fir sealing vacuum
139 a specimen holder holding cylinder
140 a shaft for driving a gate type of valve block
141 a specimen holder insertion side
142 a frame of the support roller for lifting a gate type of valve and specimen holder holding cylinder
143 a route guide roller
144 a supporting point
145 a tapered portion
146 a pre-exhaust chamber
151 a closed position of the supporting point (fulcrum)
152 an open position of the supporting point
153 a piston rod stroke distance for opening and closing
154 a position of O-ring (O-ring position of a shaft for opening and closing the gate type of valve is described at a position of opening the gate type of valve.)
161 a vacuum region side
162 a gear for rotating shaft
163 a gear for rotating a gear for rotating shaft
164 a main holding cylinder
165 a slot for receiving the pin for the rotation
166 a specimen holder insertion side
167 a shaft for opening and closing valve and specimen holder holding cylinder
168 an O-ring for sealing vacuum
169 an axis cover
170 a sphere type of valve

The invention claimed is:
1. A specimen holder tip part comprising:
a specimen setting seat,
a specimen mesh for mounting a specimen,
a specimen holding means for holding the specimen mesh, and
a clamping part that clamps the specimen holding means,
wherein the specimen holding means has a tapered or a convex portion in a side surface of the specimen holding means.
2. A specimen holder tip part according to claim 1, wherein the specimen holding means is ring-shaped.
3. A specimen holder tip part according to claim 2, wherein the specimen holding means is bead shaped ring-shaped.
4. A specimen holder tip part according to claim 1, wherein the clamping part clamps with the use of a tapered or a convex portion in a side surface part of the specimen holding means.
5. A specimen holder tip part according to claim 1, wherein the clamping part comprises an elastic member.
6. A specimen holder tip part according to claim 1, wherein the clamping part is a spring pin.
7. A specimen holder tip part according to claim 1, wherein the specimen holding means has a desorption means for desorbing the specimen holding means from the specimen holder tip part.
8. A specimen holder tip part according to claim 7, wherein the desorption means is a groove disposed on the internal diameter side of a ring-shaped member.
9. A detachment tool for detaching the specimen holding means corresponding to the desorption means according to claim 7.
10. A kit comprising a specimen holder tip part according to claim 1.
11. A specimen holder comprising a specimen holder tip part according to claim 1.
12. A specimen holder tip part comprising:
a specimen setting seat,
a specimen mesh for mounting a specimen,
a specimen holding means for holding the specimen mesh,
a fixing means for fixing the specimen holding means,
wherein the specimen holding means has an elastic member and has a tapered or a convex portion in a side surface of the specimen holding means.
13. A specimen holder tip part according to claim 12, wherein the specimen holding means comprises one or more members.
14. A specimen holder tip part according to claim 12, wherein the specimen holding means fits into a groove provided on the specimen setting seat.
15. A specimen holder tip part according to claim 12, wherein the specimen holding means has a guide groove.
16. A specimen holder tip part according to claim 12, wherein the elastic member is a hook.
17. A specimen holder comprising a specimen holder tip part according to claim 12.
18. A specimen holder tip part according to claim 12, wherein a portion of the specimen mesh is disposed between the specimen holding means and the specimen setting seat.

* * * * *